United States Patent

Brown et al.

[11] Patent Number: 4,768,698
[45] Date of Patent: Sep. 6, 1988

[54] X-Y TABLE WITH θ ROTATION

[75] Inventors: Robert G. Brown, Annapolis; Robert S. Quasney, Landstown; William J. Siegel, Silver Spring; Louis A. Abbagnaro, Columbia, all of Md.

[73] Assignee: Pace Incorporated, Laurel, Md.

[21] Appl. No.: 914,921

[22] Filed: Oct. 3, 1986

[51] Int. Cl.$^4$ .............................................. B23K 37/00
[52] U.S. Cl. .......................................... 228/18; 228/47; 228/191; 228/264; 228/20; 269/60; 269/71; 269/76; 269/203; 269/903
[58] Field of Search ............... 228/18, 20, 191, 180.2, 228/46, 47, 264; 269/60, 71, 73, 76, 203, 903

[56] References Cited

U.S. PATENT DOCUMENTS

| | | | |
|---|---|---|---|
| 3,696,985 | 10/1972 | Herring et al. | 228/180.2 |
| 3,724,068 | 4/1973 | Galli | 228/180.2 |
| 3,735,911 | 5/1973 | Ward | 228/191 |
| 3,909,933 | 10/1975 | Doubek, Jr. et al. | 228/180.2 |
| 4,078,302 | 3/1978 | Fok et al. | 269/903 |
| 4,116,376 | 9/1978 | Delorme et al. | 228/180.2 |
| 4,274,576 | 6/1981 | Shariff | 228/46 |
| 4,295,596 | 10/1981 | Doten et al. | 228/180.2 |
| 4,566,325 | 1/1986 | Rante | 269/73 |
| 4,620,659 | 11/1986 | Holdway | 228/191 |

Primary Examiner—Nicholas P. Godici
Assistant Examiner—Samuel M. Heinrich
Attorney, Agent, or Firm—Gerald J. Ferguson, Jr.

[57] ABSTRACT

A X-Y table is disclosed having a table rotatably mounted on a base for movement in the X-Y and θ directions. The device includes fine adjustments in both X and Y directions and a quick shear mechanism with means for automatically returning the table to its original position after the quick shear procedure. The table may be used as a stand above unit or particularly for use in installing and removing components from printed circuit boards.

8 Claims, 3 Drawing Sheets

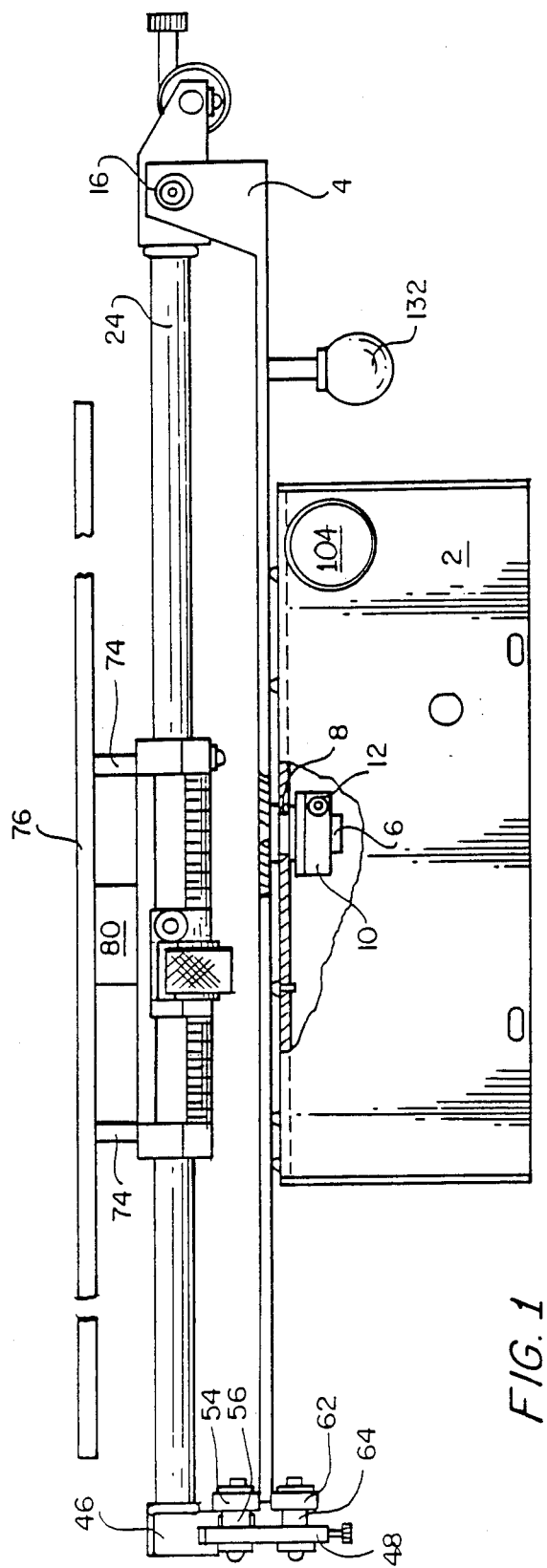
FIG. 1
FIG. 3
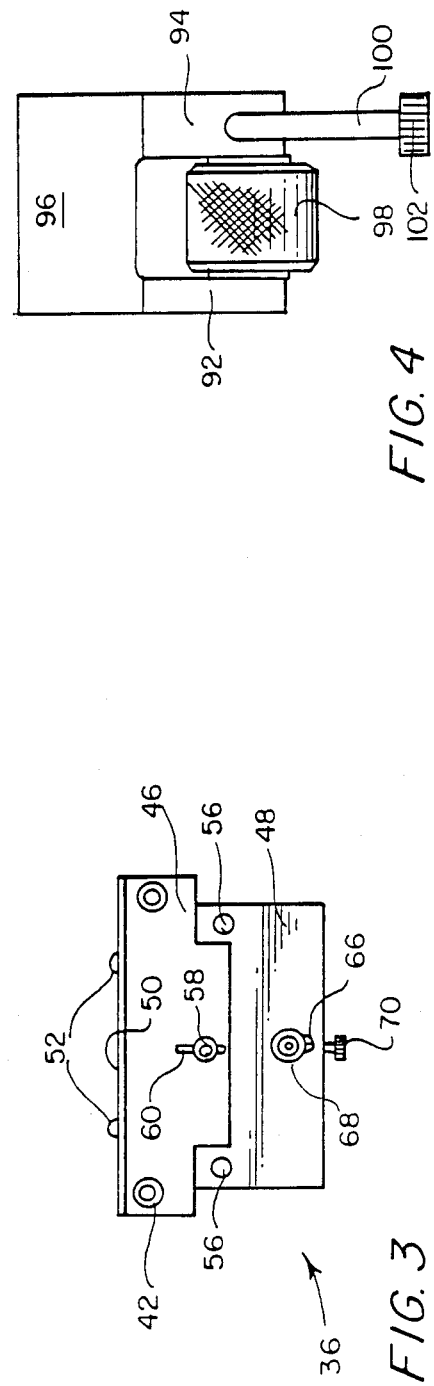
FIG. 4

X-Y TABLE WITH θ ROTATION

RELATED APPLICATIONS

This application is related to U.S. applications Ser. No. 762,843 filed Aug. 6, 1985, now U.S. Pat. No. 4,682,766, and Ser. No. 649,065 filed Sept. 10, 1984, now U.S. Pat. No. 4,659,004, both of which are assigned to the assignee of record and which are incorporated herein by reference.

BACKGROUND OF THE INVENTION

This invention relates to an X-Y table of general applicability which may be used as a stand-alone unit or which may be used with heating devices such as a heating device for attaching modular electronic components to or removing them from a substrate such as a printed circuit board.

Present day devices for removing or installing modular electronic components from a substrate, such as a printed circuit board include those which use a heated head which contacts each terminal to melt the solder thereon or those which use a blast of hot air to melt the solder. The former devices are generally very complex and employ a heated head having a plurality of spaced apart fingers, each of which must be precisely aligned with each terminal around the component to simultaneously heat the solder thereon. The component is then withdrawn from the substrate by vacuum suction or other mechanical means. The procedure is reversed for installing the component. An example of such a device is disclosed in U.S. Pat. No. 3,382,564. A major disadvantage of this type of device is that due to the ever increasing miniaturization of electronic systems, and individual components therein, the terminals of such components are extremely close together thus making precise alignment of the fingers of the heating head therewith extremely difficult.

Improper alignment or contact often results in solder flowing between terminals on the component thus shorting them or otherwise damaging them. The hot air devices direct a blast of hot air at the terminals from the source above the component to simultaneously melt the solder thereon. Such a device, for example, is disclosed in U.S. Pat. No. 4,366,925. Such a device may function satisfactorily if there is a large spacing between components such that the blast of hot air directed at one component from above will not spill over and melt the solder on the terminals of adjacent components. However, as aforementioned, not only are the components themselves becoming increasingly smaller but their proximity on the printed circuit substrate is also increasing. Thus there is a need for a device which can provide not only a closely controlled and evenly distributed source of heat sufficient to melt solder associated with component terminals or printed substrate conductors during installation or removal of electronic components relative thereto, but one which can rapidly and precisely direct this controlled heat where desired thereby minimizing the likelihood of melting the solder on the terminals of adjacent components or otherwise damaging the printed conductors on the substrate. There is also a need for a device of the aforementioned type which has the capability of precisely positioning the electronic component and its terminals on the ends of the printed conductors on the substrate to ensure no overlapping as well as removing the component to ensure that no liquid solder is smeared on the substrate between the conductors printed thereon.

Such a device is disclosed in the above-mentioned co-pending application Ser. No. 649,065 filed Sept. 10, 1984, now U.S. Pat. No. 4,659,004. In this co-pending application, supporting means for a printed circuit board having one or more components thereon, is clamped to a supporting device which is moveable in the X-Y direction. The supporting device includes a pair of rails having clamps thereon mounted on a box-like frame which is, in turn, mounted on another frame which is moveable in a pair of guides. This device is capable of only very limited movement in the X-Y directions and no table is provided thereon but instead merely a pair of clamps between which a printed circuit board may be clamped. When using this device to remove components from various portions of a printed circuit board of large size, it is necessary to unclamp the board and reclamp the board again with the component aligned as closely as possible with the nozzle which is to deliver the hot air blast to the component terminals and thereby melt the solder thereon. This continual clamping and reclamping of the board is very time consuming.

In co-pending application Ser. No. 762,843, now U.S. Pat. No. 4,682,755, an X-Y positioning system is disclosed which also includes a capability of rotating the work about an axis perpendicular to the X-Y intersection, this rotation being termed θ rotation in the present invention. However, this positioning system is also capable of only limited movement in the X-Y directions and no table is provided thereon for support of the printed circuit board; rather, as in the above positioning system, a pair of clamps is provided between which the board may be clamped.

SUMMARY OF THE INVENTION

The present invention relates to an X-Y table which may be used as a stand-alone unit or with a hot air device such as that disclosed in the co-pending application, Ser. No. 649,065. The table of the present invention is moveable through much longer distances in the X-Y directions as opposed to the tables of the above co-pending applications and has fine adjustments for adjusting the position of the table in both the X and the Y directions. The table of the invention also is rotatable on a base in order to obtain the θ direction of movement in addition to the X-Y directions. The table of the invention also includes a quick shear means for quickly shearing a component from a printed circuit board after the solder on the leads of the component has been melted and further includes means to automatically return the board to its original position after the quick shear operation. That is, in the hot air device for example, of co-pending application Ser. No. 649,065, a nozzle is employed which closely surrounds but is spaced from the component to be removed by shearing. The nozzle directs the hot air blast at the terminals to melt the solder thereat. Once the solder is melted, the component may be sheared from the board by rotating the board while the component is still within the nozzle. Moreover, in accordance with the present invention, means are provided to automatically return the printed circuit board to the original position it occupied prior to the shearing operation. Hence, installment of a new component in place of the sheared component is facilitated.

BRIEF DESCRIPTION OF THE DRAWINGS

The invention will be further illustrated by reference to the accompanying drawings in which:

FIG. 1 is a front view in elevation, partly broken away, showing the X-Y table of the invention;

FIG. 3 is a partial view of the left end of the X-Y table of the invention showing the leveling adjustment means;

FIG. 4 is a partial view of the right end of the X-Y table of the invention showing details of the fine adjustment means; and, FIG. 5 illustrates a prior art workpiece positioning system in place relative to a soldering/desoldering tool.

DESCRIPTION OF THE PREFERRED EMBODIMENT

Figure 2:
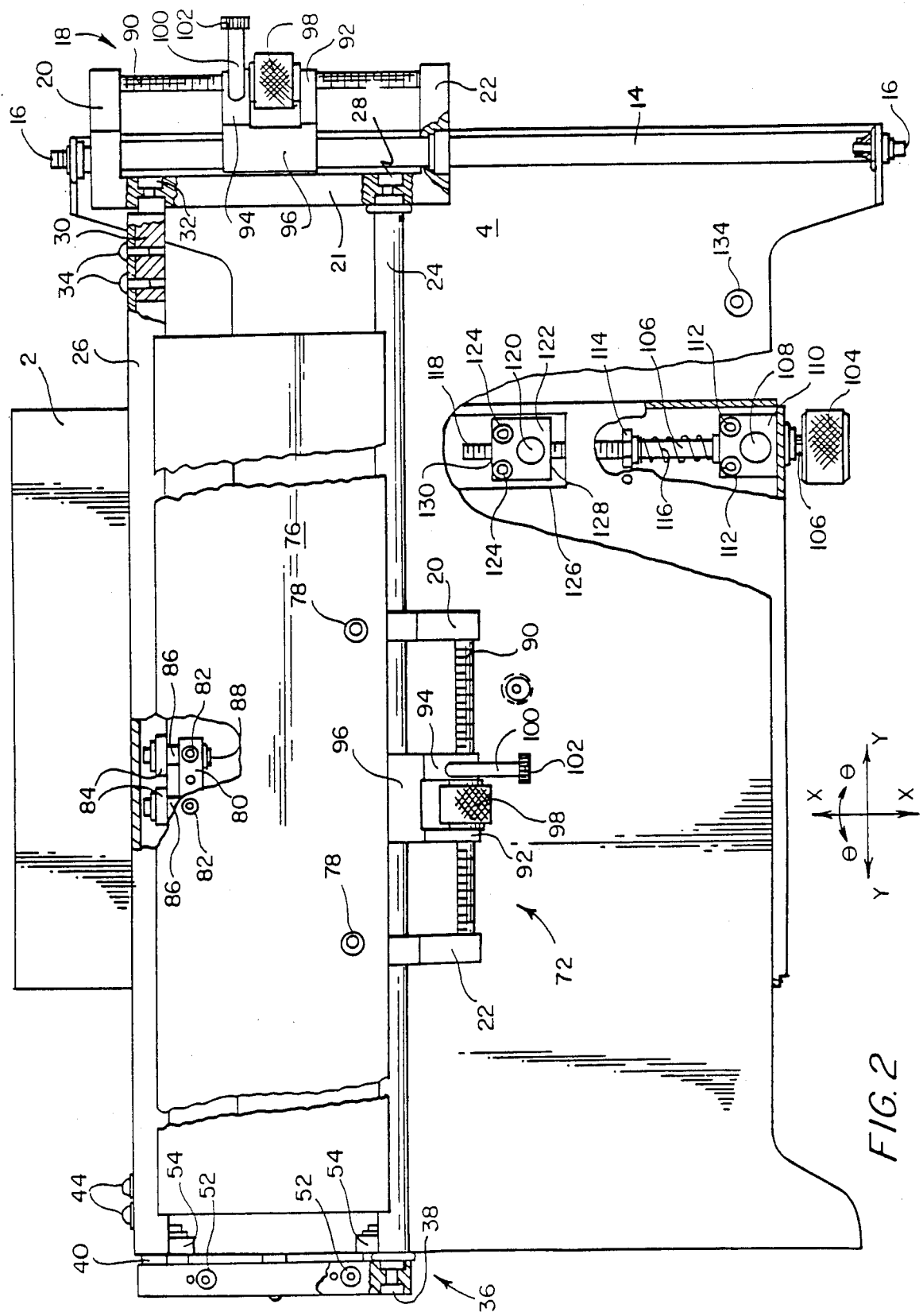
FIG. 2 is a top view of the X-Y table of the invention, partly broken away.

Referring to FIGS. 1 and 2, the device has a generally rectangular box-like base 2 which is open at the bottom. A supporting plate 4 is rotatably mounted on the base 2 by means of a shaft 6 passing through the aperture 8 in the base 2 and the plate 4 being secured against separation from the base 2 by means of the locking collar 10 which is locked in place by means of the set screw 12.

A cylindrical rod 14 is mounted on the supporting plate 4 by means of the screws 16 at either end thereof, the screws as shown being of the type which receive an Allen wrench.

A U-shaped carriage, generally indicated at 18, includes a transverse portion 21 and two arms 20 and 22, through which the rod 14 passes. The carriage 18 is slidable on the rod 14. On transverse portion 21 of the carriage 18, as shown in FIGS. 1 and 2, there is secured to the carriage 18 another cylindrical rod 24 and a channel member 26. The rod 24 is secured to the carriage 18 by means of the screw 28 which also is of the type to receive an Allen wrench, whereas the channel 26 is secured to a bracket member 30 screwed to the carriage 18 by means of the screw 32 which also is of the type to receive an Allen wrench. The channel 26 is secured to the bracket 30 by means of the metal screws 34. At the left hand end of the device as viewed in FIGS. 1 and 2, the rod 24 is secured to the end plate 36 by means of the screw 38. The left hand end of the channel 26 is secured to a bracket 40 which is secured to the end plate 36 by the screw 42, FIG. 3. The channel is secured to the bracket 40 by means of the screws 44. The end plate 36 is formed in two pieces, an upper portion 46 and a lower portion 48; the upper portion 46 has the top plate 50 thereon secured to the portion 46 by the screws 52.

The end plate 36 is supported on the supporting plate 4 by means of a pair of rollers 54 which ride on the upper surface of the supporting plate 4 and are rotatably mounted on shafts 56 which are secured in the end plate 36 by means of a press fit.

The rod 24 and the channel 26 may be leveled by loosening the screw 58 as shown in FIG. 3, and changing the position thereof up or down in the slot 60.

To prevent the end plate 36 from being lifted with respect to the supporting plate 4, a roller 62 mounted on a shaft 64 is secured in the slot 66 by means of the screw 68 as shown in FIG. 3. The roller 62 thus rolls on the underside of the supporting plate 4. The position of the roller 62 and shaft 64 is maintained by means of the screw 70 threaded into the bottom of the portion 48 of the end plate 36 and abutting against the screw 68 threaded into the end of the shaft 64.

Mounted on the rod 24 is another carriage 72 which is identical to that indicated at 18. This carriage 72 is freely slidable on the rod 24 and has two pylons 74 mounted on the top thereof. A table 76 is secured to the two pylons 74 by means of the screws 78. A printed circuit board or the like may be clamped to the top of table 76 by means of conventional clamps not shown. The table 76 is supported at its rear side, as viewed in FIG. 2, by means of a block 80 which is secured to the underside of the table 76 by means of the screws 82. Two rollers 84 travel in the channel 26 and are secured to the block 80 by means of the shafts 86 and screws 88.

From the foregoing, it will be apparent that the table 76 is freely slidable in both the X and Y directions.

To effect fine adjustment of the table 76 in either or both of the X and Y directions, carriages 18 and/or 72 are employed. These carriages each include a threaded member 90 extending between and fixed to the brackets 20 and 22. Threaded member 90 extends through apertures in two bracket arms 92 and 94 of a slide member 96 which has an aperture therein through which rod 14 passes in the carriage 18 and rod 24 passes in the carriage 72. A knurled nut 98 is mounted on the threaded member 90, having mating threads, and a locking bolt 100 having a knurled head 102 is threaded into each bracket arm 94. When the bolts 100 are threaded into each of the slides 96 sufficiently, then one contacts the rod 14 and the table 76 is no longer freely slidable in the X direction due to the locking of the bolt 100 against the rod 14, and the table 76 is no longer slidable in the Y direction either due to the locking of the other bolt 100 against the rod 24. Of course, only one bolt 100 may be locked, if desired, with the result that the table can be freely moved in either the X or Y direction. When one or both of the bolts 100 are locked against the rails 14 and/or 24 rotation of the nut 98 will effect fine adjustment of the table 76 in the X and/or Y direction by moving the nut 98 along the threaded member 90 and thereby moving the brackets 20 and 22 to either the left or right, depending upon the direction of rotation of the nut 98. Thus, fine adjustment of the table 76 can be effected in either or both of the X and Y directions.

The supporting plate 4 and all the structure thereon also may be rotated with respect to the base 2 by turning the knurled knob 104 which is mounted on a shaft 106 which extends through a plastic stud 108 in a metal block 110 secured to the supporting plate 4 by means of the screws 112. The shaft 106 has a nut 114 thereon which acts as a retainer for a compression spring 116 mounted between the nut 114 and the block 110. The shaft 106 is threaded in the portion 118 thereof between the nut 114 and the end of the shaft. The threaded portion 118 of the shaft passes through a rotatable, plastic, threaded stud 120 mounted in the block 122, which is secured to the supporting plate 4 by means of the screws 124. The block 122 moves in a cut-out portion 126 in the top of the base 2.

Thus, it will be appreciated that when the knob 104 is rotated, rotation of the threaded portion of the shaft 118 in the threaded plastic stud 20 will cause the block 122 to move within the cut-out portion 126. Inasmuch as the block 122 is secured to the supporting plate 4, plate 4 will rotate as will table 76. Rotational movement of the block 122 is facilitated by rotation of the threaded plastic stud 120 within the block 122, there being sufficient clearance in the block at both points 128 and 130 so that the supporting plate 4 may be rotated with respect to the base 2 as desired. In the present invention, rotation of block 122 is limited to about ±15° due to the size of cut-out portion 126. The amount of rotation may be more or less depending upon the requirements of the particular application.

Figure 5:
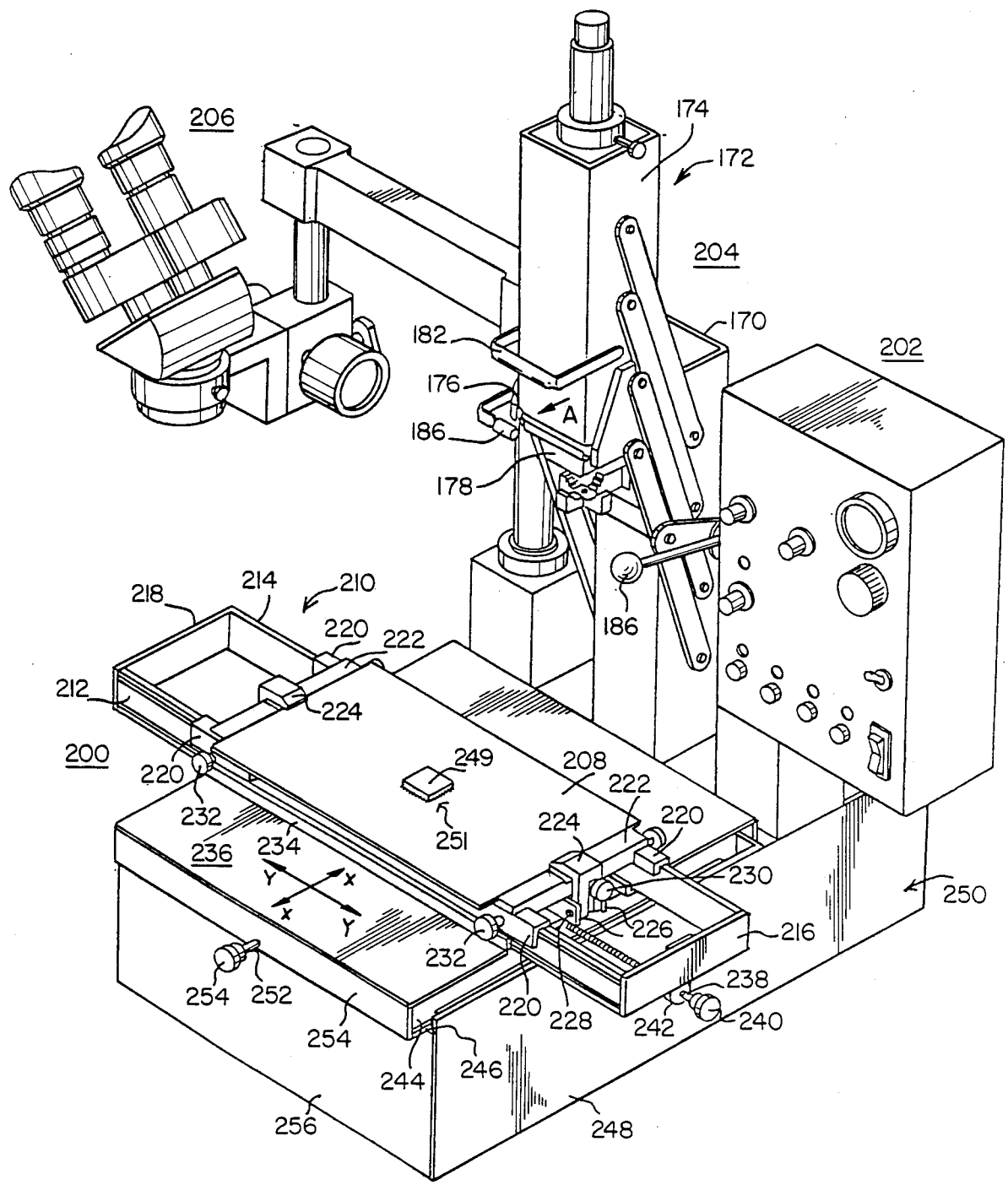

The device is also provided with a quick shear mechanism for shearing off a component from a printed circuit board after the solder on the leads has been melted and this is effected by rotating the supporting plate 4 clockwise with respect to the base 2 by pulling on the handle 132, shown in FIG. 1, in a direction perpendicular to the plane of the paper. That is, the component, as will be described below with respect to FIG. 5 is disposed within a nozzle 178 at the time the solder on the leads thereof is melted by a blast of hot air directed through the nozzle, the nozzle closely surrounding and being slightly spaced from the component. When the board is clockwise rotated by pulling on handle 132, the component remains within the nozzle and is thus sheared from the board.

The handle 132 is secured to the supporting plate 4 by the screw 134 shown in FIG. 2. When the supporting plate 4 is rotated clockwise by pulling on the handle 132, the compression spring 116 is compressed and the shaft 118, block 122, and knob 104 are moved upwardly from the plane of the paper shown in FIG. 1 and parallel to the plane of the paper shown in FIG. 2.

Upon release of the handle 132, the supporting plate 4 will immediately return to its original preset position due to the action of the compression spring 116.

In operation, a printed circuit board is clamped to the top of the table 76 by means of conventional clamps not shown, and with both of the carriages 18 and 72 unlocked, table 76 is moved in the X and Y directions to a position roughly under a hot air nozzle from which hot air is to be impinged upon a component to be removed from the printed circuit board. After the rough adjustment has been made, carriages 18 and 72 are locked with respect to sliding movement by rotation of bolts 100 and a fine adjustment is made as necessary in either or both of the X and Y directions by turning the nuts 98. Further centering may be effected by rotation of the knob 104 to rotate the table 76 in the θ direction to center the component under the hot air nozzle. After hot air has been applied to the component and the solder on the leads thereof is melted, the supporting plate 4 and the structure thereon, i.e., the table 76, is rotated clockwise by pulling on the handle 132 which causes a quick shear of the component from the printed circuit board and, after release of the handle 132, the supporting plate 4 and the structure thereon, i.e., the table 76, returns to its original position preset by the knob 104.

FIG. 5 illustrates a prior art workpiece positioning system in place relative to a soldering/desoldering tool as described in further detail in co-pending application Ser. No. 649,065. In particular, as shown in FIG. 5, there is a workpiece manipulating unit 200, a control unit 202, a component removal/installation unit 204, and a microscope unit 206. Unit 200 is adapted to receive a printed circuit board 208. Generally the board will have mounted thereon a number of semiconductor components or modules, one of which is indicated at 249 where each module includes a plurality of terminals 251. The board is held in place by a retaining member generally indicated at 210. Unit 210 includes a pair of rails 212,214 connected are slides 220. Connecting slides 220 are bars 222. Pivotally mounted with respect to bars 222 are clamps 224 for clamping board 208 with respect to bars 222. Mounted on each of the bars 222 are a pair of brackets 226. Disposed between each bracket pair is a pivot pin 228 for pivotally mounting clamp 224. Locking screws 230 are provided with knurled knobs and threaded through clamps 224 to engage bars 222 to thus lock clamps 224 in place once board 208 has been appropriately positioned between the clamps. Locking screws 232 also having knurled knobs are threaded through slides 222 to engage rails 212 and 214 to lock the board 208 with respect to the rails. The rails 212,214 are slidably mounted in a pair of guides 234 which are fixedly mounted on a movable plate 236.

Fine positional adjustment is provided by an adjusting screw 238 having a knurled knob 240, screw 238 being threaded through a bracket 242 connected to plate 216 and a side wall 244 of mounting plate 236. Hence, by rotation of screw 230, the board mounting member 210 can be longitudinally positioned along guides 234 to effect fine positioning in a first direction.

Fine positioning in the direction perpendicular to the first direction is effected in the following manner. Movable mounting plate 236 is slidably mounted in a pair of guides 246 provided at the upper inside surfaces of the side walls 248 of a stationary base member generally indicated at 250. Movable mounting plate 236 may be slid along guides 246 by adjusting screw 252 having knurled knob 254, the screw being threaded through a front wall 254 of the mounting plate and through the front wall 256 of base number 250.

It should be noted that module 249, as illustrated in FIG. 5, corresponds to a module generally known as a flat-pac carrier where the terminals 251 are flexible and extend outwardly from the main body of the module. The present invention may be used only with this type module but also with one known as a leadless chip carrier (LCC). Typically the terminals of a LCC module do not extend outwardly from the body, but are disposed on the underside thereof around the periphery.

Control unit 202 includes a control for the amount of time heated air is applied to the terminals to be soldered or desoldered; a control for the current through the heater to thus control the temperature thereof; a control for pressure of the air delivered to the unit, with a gauge indicating the air pressure level; and a control for a pre-heater. Once the heater reaches the level corresponding to the temperature set, the temperature will be maintained at that level. Furthermore, after a predetermined time (typically 45 seconds), air will start to flow from a pump through the heater, it being assumed that after the predetermined time the heater will have reached the temperature set. After the heated air has been applied for a predetermined time, a light starts to flash thereby indicating to the operator vacuum should either be (a) applied to the component if it is being removed or (b) removed therefrom if it is being installed.

Component removal/installation unit 204 includes a support column 170 upon which is pivotally mounted a component removal/installation device generally indicated at 172.

Unit 172 is adapted to receive a vacuum for manipulating the semiconductor module or component to be removed from or installed on the board. Generally, unit 172 comprises two separable parts comprising a heater unit 174 and a nozzle locator unit 176 which includes nozzle 178, the purpose of the heater unit being to apply heated air to the terminals of the semiconductor module and vacuum thereto for manipulation purposes and the purpose of the nozzle locator unit 176 with nozzle 178 being to accurately locate the heater unit 174 with respect to the semiconductor module.

Nozzle locator unit 176 can be positioned directly over module 249 by rotating it from its inoperative position shown in FIG. 5 to its position over the module. The module may then be accurately positioned beneath the nozzle locator.

The present invention may be employed in either the removal or installation of a component. The removal of a component will be described. Referring to FIG. 5, it is assumed component 249 is to be removed. First, it is generally positioned in the middle of workpiece manipulating unit 200. This is effected by first appropriately positioning the board 208 between clamps 204 and then tightening the clamps via tightening screws 230 to thus effect rough positioning of component 249 in the X direction indicated in FIG. 5. The board is then moved along rails 234 to thereby roughly position the component in the Y direction where the X and Y directions are orthogonal. Locking screws 232 are then tightened to secure this first rough position.

In order to provide more precise positioning of the component 209, the operator next pulls handle 186 in the direction of the arrow A in FIG. 5 to separate nozzle locator unit 176 from heater unit 174 whereby the nozzle locator 178 is moved into a position generally over module 249. Preferably the locator is positioned one-quarter to one-half inch above module 249 and clamped in this position by moving locking lever 186 in the clockwise direction. The component 249 may now be viewed through an opening in locator 178. Although a member using cross hairs can be employed to effect precise alignment of the module with respect to the nozzle locator, such a member need not be employed. Rather, the nozzle locator is chosen so that the lower opening thereof is only slightly greater than the periphery of the component 249. Thus, it has been found that final precise adjustment of the position of components 249 with respect to nozzle to nozzle locator 178 can be effected by first turning fine adjustment screw 238 whereby component 249 will be slightly shifted in the X direction until precise alignment is effected in this direction. Next, fine adjustment screw 252 is turned to effect precise alignment in the Y direction to thereby complete the fine adjustment of component 249 with respect to the nozzle locator. After clamp 186 is released, the nozzle locator is then reattached to heater unit 174 by pivoting it via handle 186 back to the position shown in FIG. 5. Unit 172 including both units 174 and 176 is then returned to module 249 by pulling handle 182 whereby unit 172 will not be accurately positioned with respect to the module and preferably in direct contact with board 208 or the terminals of the component.

As will be readily appreciated, the present workpiece positioning apparatus corresponds to the workpiece manipulating unit 200 of the prior art.

Whereas the invention has been described particularly with regard to the installation or removal of components from printed circuit boards, it will be apparent to those skilled in the art that the invention has wide applicability and may be used anywhere an X-Y table with fine X-Y adjustments as well as $\theta$ rotation is required.

It will be obvious to those skilled in the art that many modifications may be made within the scope of the present invention without departing from the spirit thereof and the invention includes all such modifications.

What is claimed is:

1. An X-Y table with $\theta$ rotation comprising base means, supporting plate means rotatably mounted on said base means for rotation in the $\theta$ direction, first means mounted on said supporting plate means for movement in one direction, second means mounted on said first means for movement in a direction orthogonal to the direction of the movement of said first means, and table means mounted on said second means; fine adjustment means on said first and second means; and a means for rotating said supporting plate means in said $\theta$ direction relative to said base means; said means for rotating including a shaft and a follower threadedly engaged therewith, one of said shaft and follower being mounted on said base means and the other one being mounted on said supporting plate means such that relative movement between said follower and said shaft causes rotational movement of said supporting plate means.

2. A table according to claim 1 where said table means is adapted for mounting a printed circuit board thereon where the board includes at least one electrical component soldered thereon and adapted to be removed from the board by hot air directed through a nozzle which closely surrounds and is spaced from the component to thus melt the solder, said table including means for shearing the component from the board by rotating the board to thus shear the component from the board as the component remains in the nozzle.

3. A table according to claim 2 including means for automatically returning the board to the position it occupied prior to the component being sheared from the board.

4. An X-Y table with $\theta$ rotation comprising base means, supporting plate means rotatably mounted on said base means for rotation in the $\theta$ direction, first means mounted on said supporting plate means for movement in one direction, second means mounted on said first means for movement in a direction orthogonal to the direction of the movement of said first means, and table means mounted on said second means; fine adjustment means on said first and second means; said fine adjustment means each includes screw means with nut means rotatably mounted thereon and means for locking said nut means to said first and second means.

5. A table according to claim 4 in which said locking means is a screw means adapted to be threaded against a part of said first or second means.

6. An X-Y table with a $\theta$ rotation comprising base means, supporting plate means rotatably mounted on said base means for rotation in the $\theta$ direction, first means mounted on said supporting plate means for movement in one direction, second means mounted on said first means for movement in a direction orthogonal to the direction of the movement of said first means, and table means mounted on said second means; leveling means for said first means; said leveling means including adjustable roller means adapted to roll on said supporting plate means.

7. An X-Y table with $\theta$ rotation comprising base means, supporting plate means rotatably mounted on said base means for rotation in the $\theta$ direction, first means mounted on said supporting plate means for movement in one direction, second means mounted on said first means for movement in a direction orthogonal to the direction of the movement of said first means, and table means mounted on said second means; quick shear means for moving said supporting plate means relative to a fixed member abutting a workpiece and a substrate supported on said supporting plate means for breaking a bond between the workpiece and the substrate, said quick shear means being mounted on said supporting plate means; said quick shear means including block means secured to the underside of said supporting plate means, rotatable threaded stud means in said block means, threaded rod means in said stud means and extending through said base means, and spring means biasing said supporting plate means toward a position preset by rotation of said rod means.

8. A table according to claim 7 including knob means fixed for rotation with said threaded rod means where the latter extends through said base means.

* * * * *